(12) United States Patent
Sakamoto

(10) Patent No.: US 6,191,434 B1
(45) Date of Patent: Feb. 20, 2001

(54) SEMICONDUCTOR DEVICE MEASURING SOCKET HAVING SOCKET POSITION ADJUSTMENT MEMBER

(75) Inventor: Iwao Sakamoto, Kagoshima (JP)

(73) Assignee: Sony Corporation, Tokyo (JP)

( * ) Notice: Under 35 U.S.C. 154(b), the term of this patent shall be extended for 0 days.

(21) Appl. No.: 09/256,359

(22) Filed: Feb. 24, 1999

(30) Foreign Application Priority Data

Feb. 25, 1998 (JP) ................................................. 10-044007

(51) Int. Cl.$^7$ ................................................. H01L 23/58
(52) U.S. Cl. .......................... 257/48; 257/674; 257/690; 257/692
(58) Field of Search ............................... 257/48, 674, 690, 257/692, 693, 694, 695, 696; 438/14, 15, 16, 17, 18, 11, 106; 428/620; 324/750, 755, 759

(56) References Cited

U.S. PATENT DOCUMENTS

| | | | |
|---|---|---|---|
| 5,313,368 | * 5/1994 | Volz et al. | 361/774 |
| 5,518,410 | * 5/1996 | Masami | 439/71 |
| 6,069,481 | * 5/2000 | Matsumura | 324/755 |
| 6,121,063 | * 9/2000 | Liu et al. | 438/15 |

FOREIGN PATENT DOCUMENTS

| | | | |
|---|---|---|---|
| 1-223364 | * | 9/1989 | (JP) . |
| 2-37683 | * | 2/1990 | (JP) . |
| 6-203938 | * | 7/1994 | (JP) . |
| 6-310231 | * | 11/1994 | (JP) . |
| 7-159487 | * | 6/1995 | (JP) . |

* cited by examiner

Primary Examiner—Olik Chaudhuri
Assistant Examiner—Alonzo Chambliss
(74) Attorney, Agent, or Firm—Ronald P. Kananen; Rader, Fishman & Grauer

(57) ABSTRACT

A semiconductor device measuring socket includes a wiring pattern board on which a test circuit is formed; a substantially S-shaped contact for electrically connecting the wiring pattern board to external leads arrayed on a semiconductor device; a supporting member for elastically supporting the contact under tiltable condition; a socket main body for storing thereinto the contact and the supporting member and for mounting the wiring pattern board on a lower portion of the socket main body; and adjusting means for adjusting a tilting amount of the contact with respect to the socket main body. When the wiring pattern board is mounted on the socket main body, a lower end portion of the contact which is projected from the lower surface of the socket main body is depressed by the wiring pattern board to thereby tilt the contact, whereby a contact position between the external lead and the contact is determined.

4 Claims, 6 Drawing Sheets

SEMICONDUCTOR DEVICE MEASURING SOCKET HAVING SOCKET POSITION ADJUSTMENT MEMBER

BACKGROUND OF THE INVENTION

The present invention generally relates to a semiconductor device measuring socket capable of adjusting CONTACT positions, and a semiconductor device manufacturing method using this socket. More specifically, the present invention is directed to such a semiconductor device measuring socket having a substantially S-shaped contact, and usable in electrically measuring of a high frequency surface mounting type plastic package, and also to a semiconductor device manufacturing method, while using this semiconductor device measuring socket.

Conventionally, when electrical characteristics semiconductor plastic package components employed in high frequency circuits are measured, measuring sockets equipped with substantially S-shaped contacts are utilized. These conventional measuring sockets are capable of shortening distances defined from external leads of semiconductor devices up to wiring pattern boards (DUT boards) on which test circuits are formed.

FIG. 1 schematically represents a major structural portion of this sort of conventional semiconductor device measuring socket indicated by reference numeral 1. As represented in FIG. 1, substantially S-shaped contacts 3 are arranged in a space 2a formed inside a socket main body 2 in correspondence with external leads 11 of a semiconductor device 10 which constitutes a surface mounting type semiconductor package component. The substantially S-shaped contacts 3 are manufactured by plating gold on copper. The external leads 11 are electrically connected to a wiring pattern board 5 via these contacts 3. Both the socket main body 2 and the wiring pattern board 5 are detachably supported by a base 6 by employing fastening means such as a bolt (not shown). A supporting member 4 made of rubber is inserted into an inner peripheral portion (inner circumference) of each curved portion of the contacts 3. Both ends of this supporting member 4 are fixed on the socket main body 2. When the wiring pattern board 5 is mounted on the lower portion of the socket main body 2, since the lower end portions of the contacts 3 which are projected from the lower end surface of the socket main body 2 are depressed against the wiring pattern board 5, the contacts 3 are inclined to the inside of the socket main body 2 against elastic force of the supporting member 4, as indicated in FIG. 3. At this time, the contact condition between the contacts 3 and the land portion of the wiring pattern board 5 can be maintained by utilizing recovery force of the supporting member 4.

Before the wiring pattern board 5 is mounted on the lower portion of the socket main body 2, an interval between contact positions C and C of the contacts 3 and 3 located opposite to each other with respect to the external leads 11 is equal to $L_0$ (see FIG. 4A), whereas after the wiring pattern board 5 is mounted, an interval between these contact positions C and C is equal to L ($<L_0$) (see FIG. 4B). In this case, the contact positions C and C correspond to vertexes of these contacts 3 and 3. This interval L is previously set in correspondence with an interval between a right lead array and a left lead array of the semiconductor device 10. It should be understood that the supporting member 4 is not shown in FIG. 4A and FIG. 4B.

The conventional semiconductor device measuring socket 1 having the above-described structure has where the contact positions C cannot achieve a better contact conditions when the right/left lead widths (namely, widths among right lead array and left lead array) of the semiconductor device 10 fluctuate. That is, in order to establish better contact conditions between the external leads 11 whose tip portions are bent along the horizontal direction, and the contacts 3 whose the peripheral portions are shaped as an arc shape, the vertexes of the contacts 3 must to be set as the contact positions C. Since formation of these contact positions C is limited only to a very narrow range, improved contact conditions cannot be established with respect to the semiconductor device having the lead width which cannot be fixedly fitted to the interval L of the contact positions C. This interval L is temporarily determined when the semiconductor device is mounted on the wiring pattern substrate 5. As a result, the correct measurement could not be determined.

There are differences in the fluctuations (50 $\mu$m to 300 $\mu$m) of this lead width, depending upon the manufacturing lot. As a consequence, the contact positions C which have been fitted before the measurement is commenced are required to be again adjusted. However, in the conventional semiconductor device measuring socket 1, this contact position adjustment could not be carried out. As a consequence, the sockets which can be fitted to the respective fluctuations must be manufactured, resulting in higher manufacturing cost. In such a case that one socket whose contact positions are not correctly fitted to contacts of a semiconductor device under measurement is directly used, measurements must be repeated several times, resulting in large temporal loss.

SUMMARY OF THE INVENTION

The present invention has been made to solve the above-explained problems, and therefore, has an object to provide a semiconductor device measuring socket capable of adjusting contact positions thereof, and also a semiconductor device manufacturing method, with employment of such a semiconductor device measuring socket.

To achieve the object, a semiconductor device measuring socket, according to an aspect of the present invention, is featured by comprising:

a wiring pattern board on which a test circuit is formed;

a substantially S-shaped contact for electrically connecting the wiring pattern board to external leads arrayed on a semiconductor device;

a supporting member for elastically supporting the contact under tiltable condition;

a socket main body for storing thereinto the contact and the supporting member and for mounting the wiring pattern board on a lower portion of the socket main body; and adjusting means for adjusting a tilting amount of the contact with respect to the socket main body;

wherein:

when the wiring pattern board is mounted on the socket main body, a lower end portion of the contact which is projected from the lower surface of the socket main body is depressed by the wiring pattern board to thereby tilt the contact, whereby a contact position between the external lead and the contact is determined.

Furthermore, a semiconductor device manufacturing method, according to another aspect of the present invention, is featured by such a method for manufacturing a semiconductor device, comprising a step for measuring the semiconductor device by employing a semiconductor device measuring socket having: a wiring pattern board on which a test circuit is formed; a substantially S-shaped contact for electrically connecting the wiring pattern board to external leads arrayed on a semiconductor device; a supporting member for elastically supporting the contact under tiltable condition; a socket main body for storing thereinto the contact and the supporting member and for mounting the wiring pattern board on a lower portion of the socket main body; wherein:

a step for adjusting a tilting amount of the contact by employing adjusting means provided on the semiconductor device measuring socket is executed before the semiconductor device measuring step in such a case that when the wiring pattern board is mounted on the socket main body, a lower end portion of the contact which is projected from the lower surface of the socket main body is depressed by the wiring pattern board to thereby tilt the contact, whereby a contact position between the external lead and the contact is determined.

As previously described, in accordance with the present invention, the contact positions with respect to the socket main body, which are changed before/after mounting the wiring pattern board, are determined based on the tilting amount of the contacts when the wiring pattern board is mounted on the socket main body. Therefore, the above-described adjusting means capable of adjusting the tilting amount of the contacts is newly employed so as to correctly adjust the contact positions.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENTS

Referring now to drawings, various preferred embodiments of the present invention will be described in detail.

Figure 1:
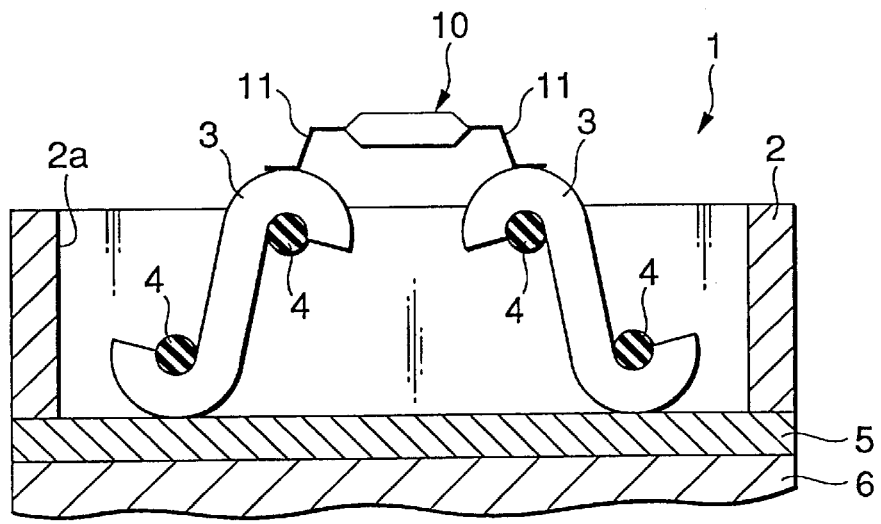
FIG. 1 is a cross-sectional view for schematically showing the major portion of the conventional semiconductor device measuring socket.
Figure 2:
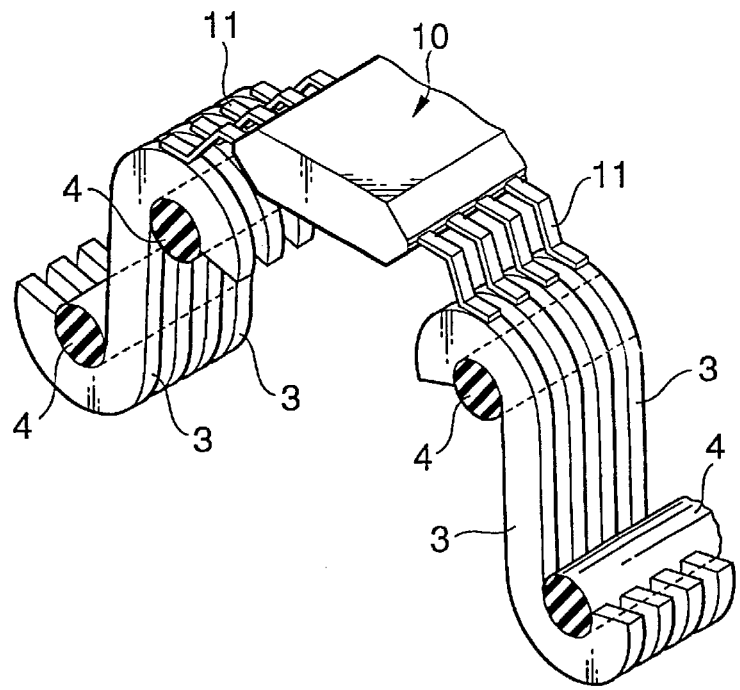
FIG. 2 is a perspective view for representing a positional relationship between the conventional socket and the semiconductor device.
Figure 3:
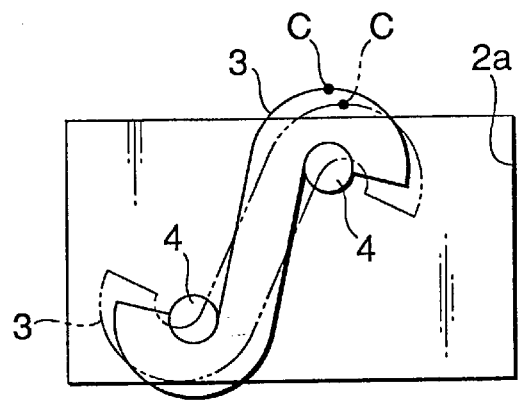
FIG. 3 is a cross-sectional view for schematically showing the effects of the contact in the conventional socket.
Figure 4A:
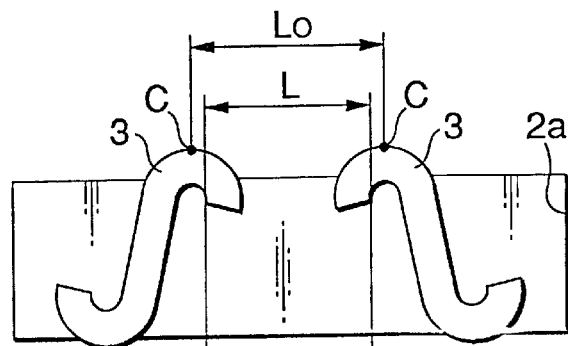
FIG. 4A and FIG. 4B schematically illustrate the effects of the conventional socket before/after the wiring pattern board is mounted to the conventional socket.
Figure 4B:
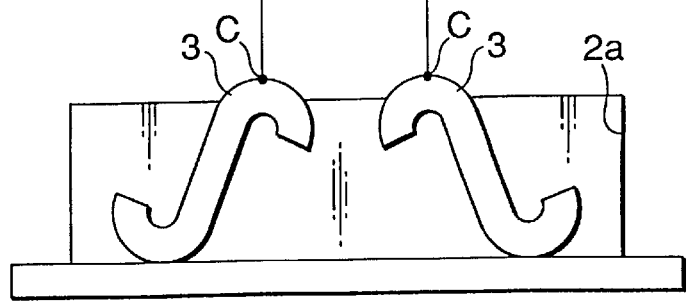
Figure 5:
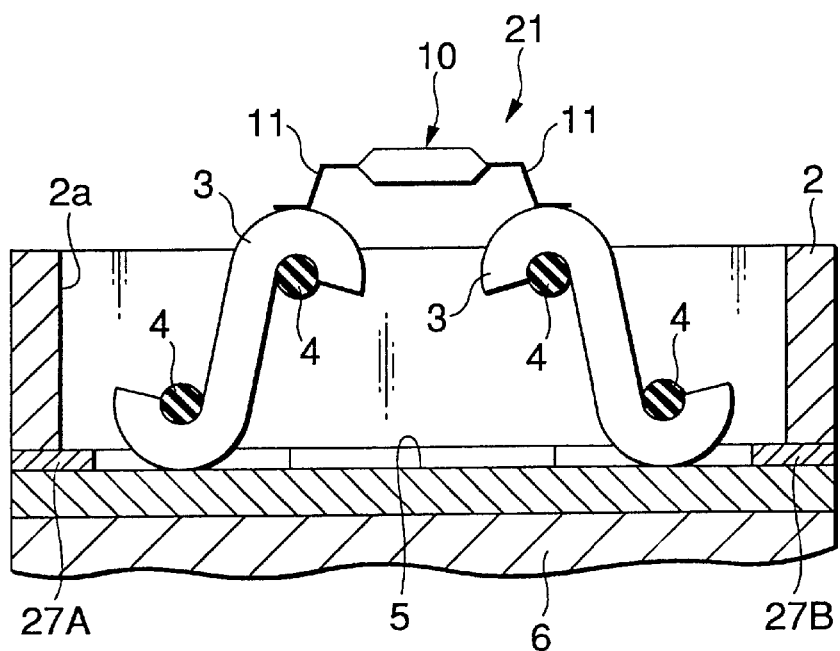
FIG. 5 is a cross-sectional view for schematically showing a major portion of a semiconductor device measuring socket according to an embodiment of the present invention.
Figure 6:
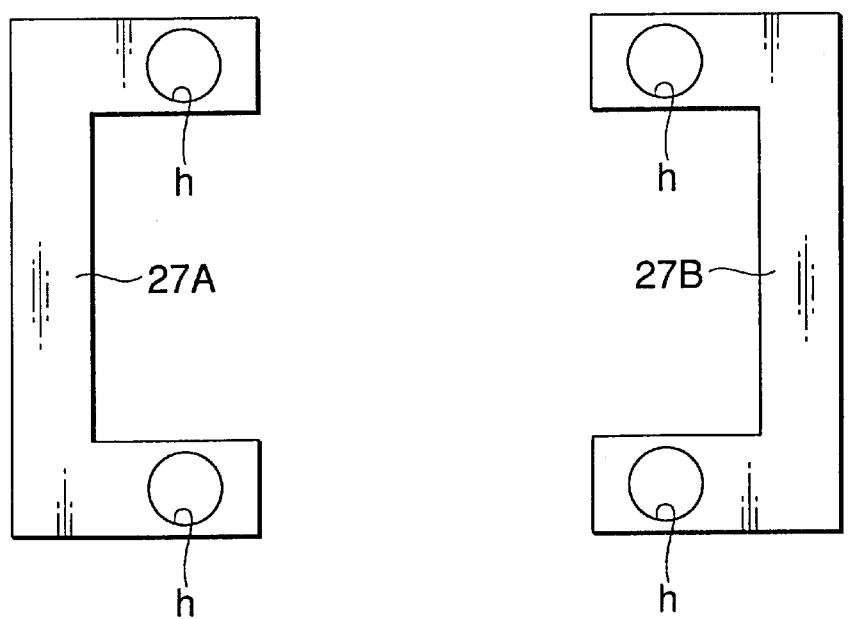
FIG. 6 is a plan view for indicating a spacer employed in the semiconductor device measuring socket of FIG. 5.

FIG. 5 schematically represents a major portion of a semiconductor device measuring socket according to an embodiment of the present invention. This semiconductor device measuring socket is indicated by reference numeral 21. It should be noted that the same reference numerals shown in FIG. 1 will be employed as those for denoting the same, or similar components of the semiconductor device measuring device shown in FIG. 5, and therefore, detailed explanations thereof are omitted. In accordance with this embodiment, a pair of spacers 27A and 27B indicated in FIG. 6 are interposed between a socket main body 2 and a wiring pattern board 5. Each of these spacers 27A and 27B is a thin metal plate made of stainless steel, and these spacers 27A and 27B have the same thickness. The paired spacers 27A and 27B are fixed via bolt mounting holes h onto the socket main body 2 and the wiring pattern board 5. It should also be noted that these spacers 27A and 27B are employed as one pair of members in this embodiment. Alternatively, these spacers may be apparently substituted by a single member.

Figure 7:
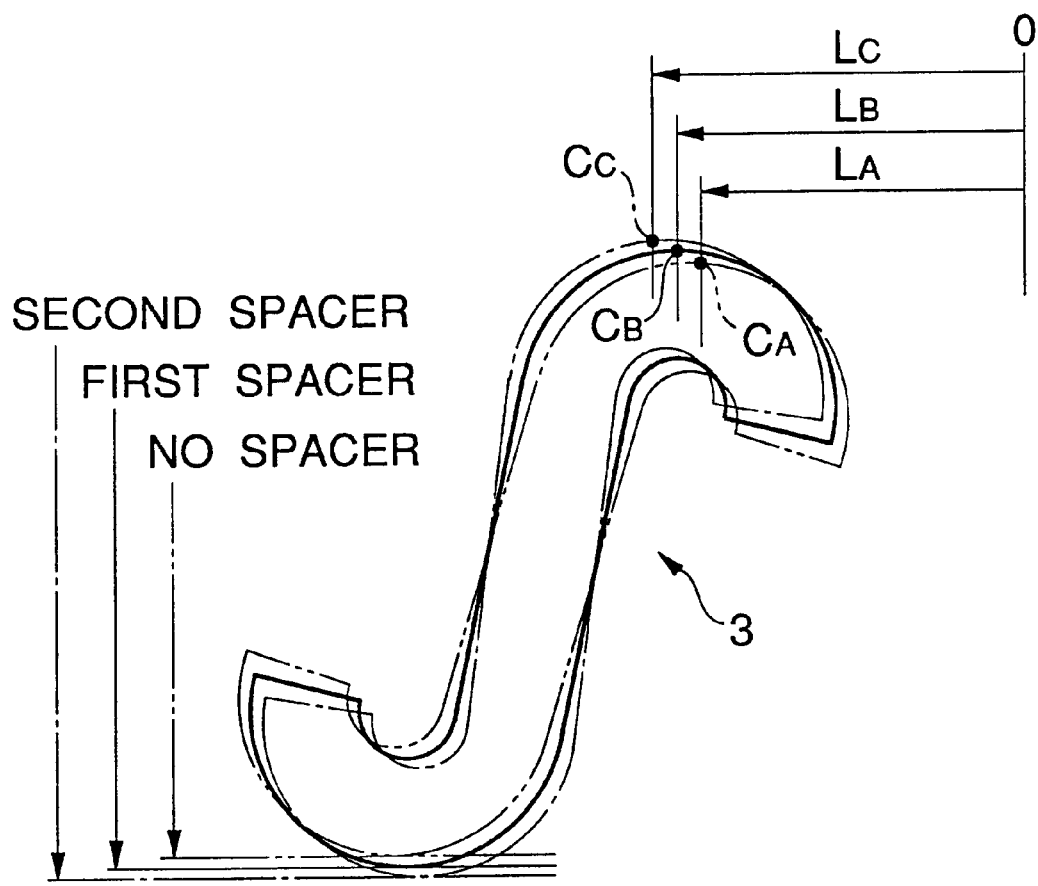
FIG. 7 is a side view for schematically indicating effects of the semiconductor device measuring socket of FIG. 5.

In other words, in accordance with this embodiment, in the case that the contacts 3 are forcibly pushed into the socket main body 2 when the wiring pattern board 5 is mounted on the socket main body 2, the pushing amount is adjustable by these spacers 27A and 27B. These spacers 27A and 27B are interposed between the socket main body 2 and the wiring pattern board 5 as an adjusting means for adjusting a tilting amount of the contact 3. For instance, as represented in FIG. 7, the tilting amount of the contacts 3 is adjusted when there is no spacer, and also when two sets of spacers having different thicknesses are employed. It is assumed that these two spacers correspond to a first spacer having a thickness of 50 $\mu$m and a second spacer having a thickness of 100 $\mu$m. As apparent from FIG. 7, distances $L_A$, $L_B$, and $L_C$ defined from a vertical bisector (will be referred as a reference line O) made between the contacts located opposite to each other, up to each of contact positions $C_A$, $C_B$, and $C_C$ are varied. In this case, a dot/dash line represents such a case that the second spacer is employed, a solid line indicates such a case that the first spacer is employed, and a two-dot/dash line indicates such a case that no spacer is employed.

As previously explained, a desirable contact position can be obtained by adjusting the thicknesses of the spacers, or by interposing, or not interposing the spacers between the socket main body 2 and the wiring pattern board 5. As a result, the contact positions can be freely adjusted in fitting of the lead widths of the semiconductor device 10. Also, such a measuring socket is no longer manufactured in accordance with the fluctuations in the lead widths of the semiconductor advice 10. Moreover, a desirable measuring socket 21 can be readily obtained by simply adding the spacers 27A and 27B to the conventional measuring socket. In addition, the spacer 27A and the spacer 27B are merely interposed between the detachable socket main body 2 and the wiring pattern board 5 by using the fasten means such as bolts. Therefore, these spacers 27A and 27B can be easily mounted and/or replaced by other spacers. Furthermore, it is not require to manufacture such a member for supporting these spacers 27A and 27B.

Figure 8A:
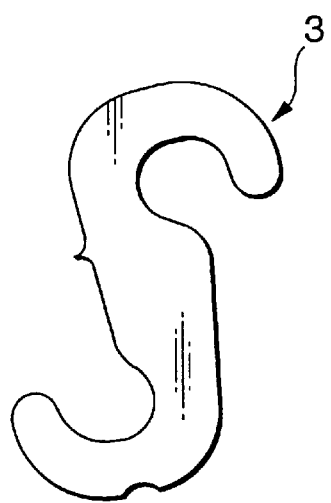
FIG. 8A is an outer view of the conventional contact.
Figure 8B:
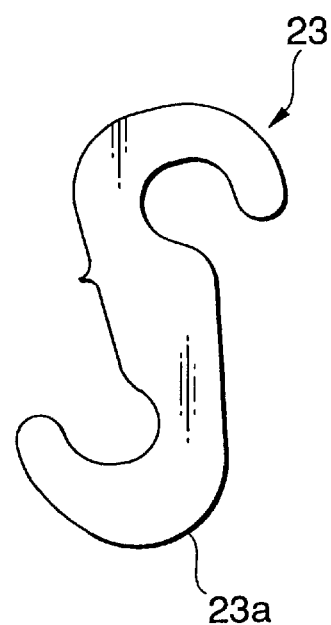
FIG. 8B is an outer view of a contact employed in the semiconductor device measuring socket of FIG. 5.

Alternatively, to expand the adjusting range of the contact positions by these spacers 27A and 27B, the below-mentioned contact 23 may be employed, so that the adjusting effects of the contact positions by the spacers 27A and 27B may be emphasized. This contact 23 is such a contact that a projection portion 23a (see FIG. 8B) projected to the side of the wiring pattern board 5 is formed at an outer peripheral portion of a lower curved portion of a conventional contact (namely, outer shape of actual product) 3 indicated in FIG. 8A. In other words, as previously explained, the adjusting effect of the contact positions by the spacers 27A and 27B is adjustable by the pushing amount of the contact 3 projected from the lower surface of the socket main body 2 when the wiring pattern board 5 is mounted. As a result, the maximum thicknesses of these spacers 27A and 27B are limited by the projection amount of the contact 3 from this socket main body 2. Therefore, if the projection portion 23a is formed to increase the projection amount of the above-described contact 3, then the above-described problem can be solved. As a consequence, the adjustable range of the contact positions can be expanded.

While the various preferred embodiments have been described in detail, the present invention is not limited thereto, but may be modified, changed, or substituted without departing from the technical scope and spirit of the present invention.

Figure 9A:
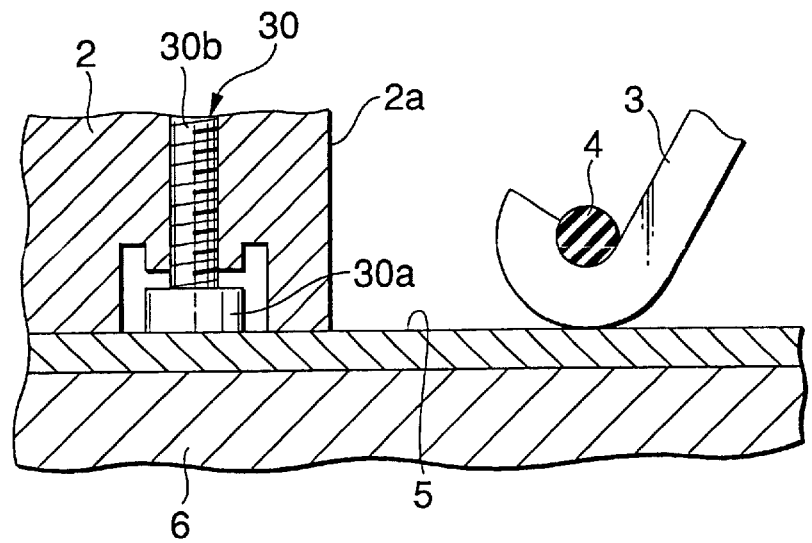
FIG. 9A and FIG. 9B are sectional views for indicating a major portion of an adjusting means according to a modification of the present invention when the adjusting means is not operated, and under operation, respectively.
Figure 9B:
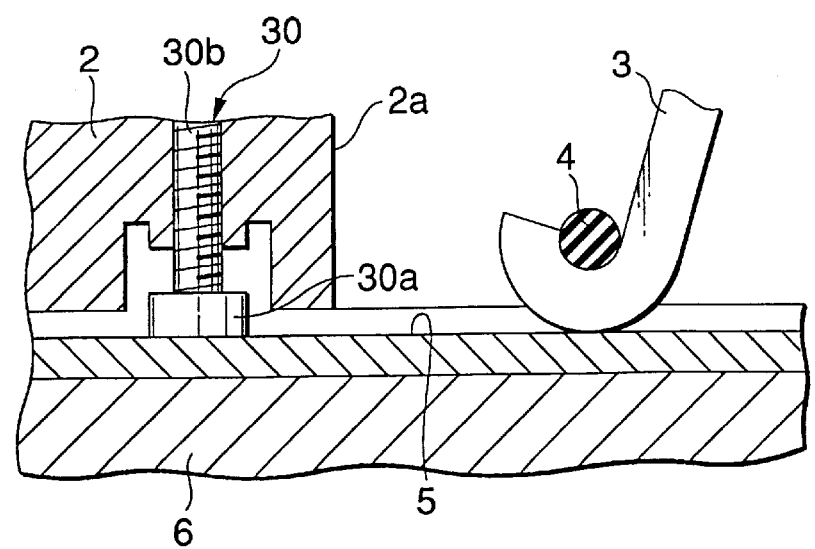

For example, in the above-explained embodiment, both the spacers 27A and 27B are interposed between the socket main body 2 and the wiring pattern board 5 as the adjusting means for adjusting the tilting amount of the contact 3. The present invention is not limited thereto, but may be modified. Alternatively, as indicated in FIG. 9A and FIG. 9B, adjusting means 30 capable of adjusting desirable spaces between the socket main body 2 and the wiring pattern board 5 may be provided at four corners of the socket main body 2. The adjusting means 30 is constituted by an abutting portion 30a which abuts against the upper surface of the wiring pattern board 5, and an abutting portion 30b which is integrally fixed on this abutting portion 30a. Under such a condition as shown in FIG. 9A, the bolt portion 30b is pivotally moved from the upper surface side of the socket main body 2, and the socket main body 2 is pushed up by a preselected amount by this abutting portion 30a. Thus, a desirable space may be formed between the socket main body 2 and the wiring pattern body 5, as represented in FIG. 9B. With employment of this alternative structure, it is possible to achieve a similar effect to that of the above-explained embodiment. The tilting amount of the contact 3 is adjusted so as to thereby fine-adjust the contact positions.

Also, in the above-explained embodiment, the bolt is employed as the fastening means capable of detachably mounting both the socket main body 2 and the wiring pattern board 5. Alternatively, when the socket main body 2 is coupled to one end portion of the wiring pattern board 5 by employing a hinge and the other end portion thereof is fixed by a clamping member, the spacers may be easily mounted and/or replaced.

As previously described in detail, in accordance with the semiconductor device measuring socket of the present invention, since the adjusting means is employed which is capable of adjusting the tilting amount of the contacts when the wiring pattern board is mounted on the socket main body, the contact positions can be adjusted in correspondence with the right/left lead widths of the semiconductor device. As a consequence, such a semiconductor device having fluctuations in the lead widths can be correctly measured by using this semiconductor device measuring socket.

What is claimed is:

1. A semiconductor device measuring socket comprising:

a wiring pattern board on which a test circuit is formed;

a substantially S-shaped contact for electrically connecting said wiring pattern board to external leads arrayed on a semiconductor device;

a supporting member for elastically supporting said contact in a tiltable condition;

a socket main body for storing said contact and said supporting member and for mounting said wiring pattern board on a lower portion of said socket main body; and at least one planar adjusting member for adjusting a tilting amount of said contact with respect to said socket main body, said planar adjustment means being disposed between said socket main body and said wiring pattern board wherein, when said wiring pattern board is mounted on said socket main body, a lower end portion of said contact which is projected from the lower surface of said socket main body is depressed by said wiring pattern board to thereby tilt said contact, whereby a contact position between said external lead and said contact is determined.

2. A semiconductor device measuring socket as claimed in claim 1 wherein:

said adjusting means is a thin film spacer having a thickness smaller than a projection amount of said contact, which projects from the lower surface of said socket main body.

3. A semiconductor device measuring socket as claimed in claim 1, further comprising:

fastening means for detachably fastening said wiring pattern board to said socket main body.

4. A semiconductor device measuring socket as claimed in claim 1 wherein:

a protection portion is formed on an outer peripheral region of a lower curved portion of said contact so as to additionally emphasize the adjusting effect achieved by said adjusting means, said projection portion projecting toward said wiring pattern board.

* * * * *